(12) United States Patent
Manapat et al.

(10) Patent No.: US 6,388,939 B1
(45) Date of Patent: May 14, 2002

(54) DUAL PORT SRAM

(75) Inventors: Rajesh Manapat, Mountain View; Sunil Kumar Koduru, Sunnyvale, both of CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/633,514

(22) Filed: Aug. 7, 2000

Related U.S. Application Data
(60) Provisional application No. 60/156,849, filed on Sep. 30, 1999.

(51) Int. Cl.$^7$ .................................................. G11C 8/00
(52) U.S. Cl. .............. 365/230.05; 365/154; 365/189.02
(58) Field of Search ............................ 365/230.05, 154, 365/189.02, 189.01, 230.01, 191

(56) References Cited

U.S. PATENT DOCUMENTS

| | | | | | |
|---|---|---|---|---|---|
| 5,424,995 A | * | 6/1995 | Miyazaki et al. | ...... | 365/230.05 |
| 5,502,683 A | * | 3/1996 | Marchioro | ............. | 365/230.05 |
| 5,699,317 A | * | 12/1997 | Sartore et al. | ......... | 365/230.06 |
| 5,768,211 A | * | 7/1998 | Jones et al. | ............ | 365/230.05 |
| 6,181,595 B1 | * | 1/2001 | Hawlins et al. | ............. | 365/156 |

* cited by examiner

Primary Examiner—David Nelms
Assistant Examiner—Hoai V. Ho
(74) Attorney, Agent, or Firm—Christopher P. Maiorana, P.C.

(57) ABSTRACT

A dual port memory comprising a memory array, a first address circuit, a second address circuit, a timing circuit, a first data circuit and a second data circuit. The memory array may be configured to (i) write information to a first port or (ii) read information from a second port in response to (i) one or more first timing signals and (ii) one or more second timing signals. The first address circuit may be configured to present one or more first control signals in response to one or more first address signals. The second address circuit may be configured to present one or more second control signals in response to one or more second address signals. The timing circuit may be configured to present the one or more first timing signals and the one or more second timing signals in response to the one or more first control signals and the one or more second control signals. The first data circuit may be configured to read or write information from the first port of the memory array. The second data circuit may be configured to read or write information from the second port of the memory array.

20 Claims, 6 Drawing Sheets

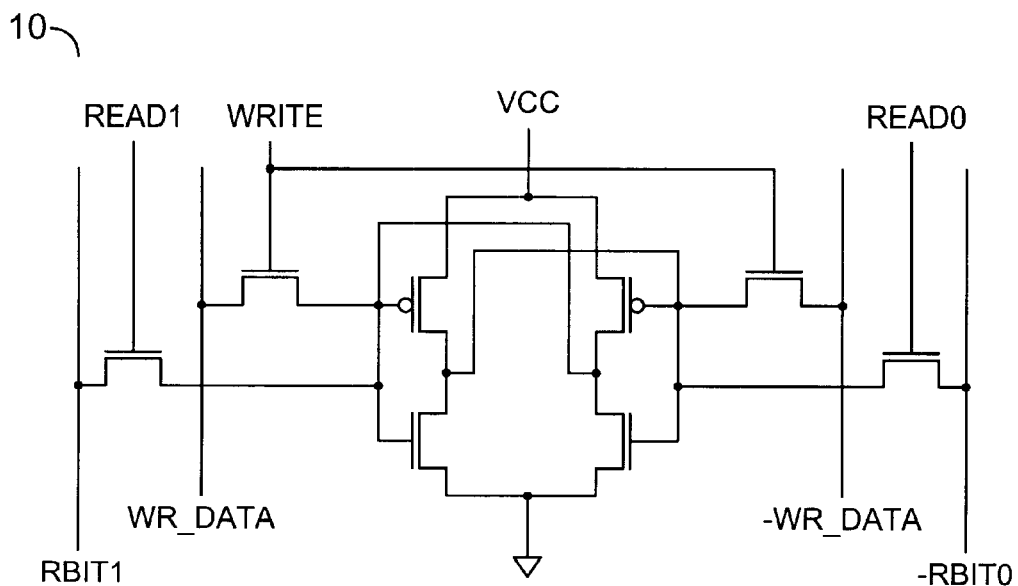
FIG. 1
(CONVENTIONAL)

DUAL PORT SRAM

This application claims the benefit of U.S. Provisional Application No. 60/156,849, filed Sep. 30, 1999 and is hereby incorporated by reference in its entirety.

FIELD OF THE INVENTION

The present invention relates to dual port memories generally and, more particularly, to a dual port memory with a reduced bus latency.

BACKGROUND OF THE INVENTION

A dual port memory provides two access ports, such as a left port and a right port, that may access a common memory array. Conventional dual port memories may be implemented with 8-T (i.e., 8 transistor) cells in the memory array. FIG. 1 illustrates an example of an 8-T cell 10. The 8-T cell 10 has a first bit-line pair (i.e., RBIT1 and −RBIT0) and a second bit-line pair (WR_DATA and −WR_DATA). The bit-line pair RBIT1 and −RBIT0 is used to read information from the 8-T cell 10 and the bit-line pair WR_DATA and −WR_DATA is used to write information to the 8-T cell 10. Separate bit-line pairs for reading and writing generally require 8 transistors to implement the 8-T cell 10. As densities of memory devices increase, the requirement of duplicating an 8-T cell 10 at each location of the memory array can consume a large amount of die area.

SUMMARY OF THE INVENTION

The present invention concerns a dual port memory comprising a memory array, a first address circuit, a second address circuit, a timing circuit, a first data circuit and a second data circuit. The memory array may be configured to (i) write information to a first port or (ii) read information from a second port in response to (i) one or more first timing signals and (ii) one or more second timing signals. The first address circuit may be configured to present one or more first control signals in response to one or more first address signals. The second address circuit may be configured to present one or more second control signals in response to one or more second address signals. The timing circuit may be configured to present the one or more first timing signals and the one or more second timing signals in response to the one or more first control signals and the one or more second control signals. The first data circuit may be configured to read or write information from the first port of the memory array. The second data circuit may be configured to read or write information from the second port of the memory array.

The objects, features and advantages of the present invention include providing a dual port memory that may be (i) implemented with 6-T cell memory locations, (ii) provide access speeds that may be comparable with an 8-T cell dual port memory, (iii) eliminate wait states between consecutive read and write operations and/or (iv) provide an improved throughout by reducing bus latency.

BRIEF DESCRIPTION OF THE DRAWINGS

These and other objects, features and advantages of the present invention will be apparent from the following detailed description and the appended claims and drawings in which:

FIG. 1 is a diagram of a conventional 8-T cell;

DETAILED DESCRIPTION OF THE PREFERRED EMBODIMENTS

Figure 2:
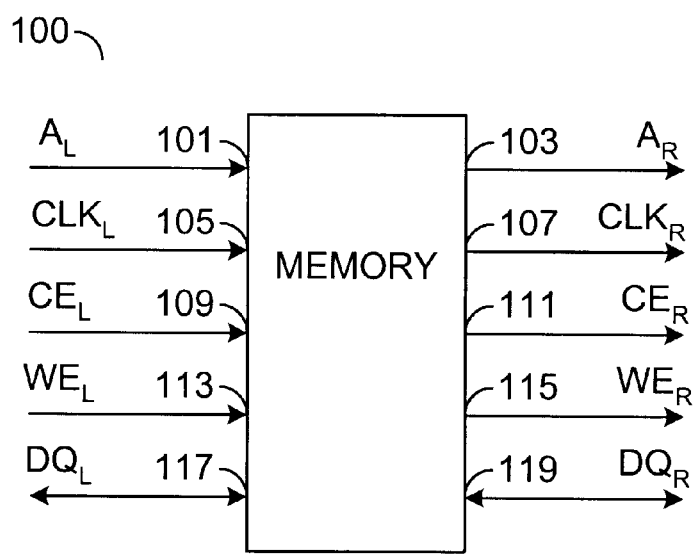
FIG. 2 is a block diagram of a preferred embodiment of the present invention.

Referring to FIG. 2, a block diagram of a dual port memory 100 is shown in accordance with a preferred embodiment of the present invention. The dual port memory 100 may comprise a left and right port (to be described in detail in connection with FIG. 3). Each port may have an independent address signals, data signals, control signals and clock signals. The memory 100 may receive a signal (e.g., AL) at an input 101. The memory 100 may receive a signal (e.g., AR) at an input 103. The signals AL and AR may be implemented as left and right address inputs, respectively. The left and right address inputs AL and AR may indicate to the internal logic (to be discussed in connection with FIG. 3) where data is located within the left and right ports of the dual port memory 100.

The memory 100 may receive a clock signal (e.g., CLKL) at an input 105. The memory 100 may receive a clock signal (e.g., CLKR) at an input 107. The signals CLKL and CLKR may be implemented as left and write clock signals, respectively. The clock signals CLKL and CLKR may control reading and writing of data to/from the dual port memory 100. The memory 100 may receive a signal (e.g., CEL) at an input 109 and a signal (e.g., CER) at an input 111. The signals CEL and CER may be implemented as chip select signals, or any other type signal in order to meet the criteria of a particular implementation. The chip select signals CEL and CER may be implemented in order to indicate reading and writing to/from the left and right ports of the memory 100, respectively. The chip select signals CEL and CER may indicate to the internal logic that some action (either a read or a write) has been preformed on the memory 100. The chip select signals CEL and CER may indicate an action during a first state (e.g., active low).

The memory 100 may receive an enable signal (e.g, WEL) at an input 113 and an enable signal (e.g, WER) at an input 115. The enable signals WEL and WER may be implemented as write enable signals for the left and right port, respectively. The write enable signals WEL and WER may indicate to the internal logic that a write has to be conducted to the memory 100. The write enable signals may indicate a write during a first state (e.g., active low). The enable write signals WEL and WER and the chip select signals CEL and CER may all be asserted "active low" to allow writing to the dual port memory 100.

The memory 100 may additionally be connected at a connection 117 to a pin (e.g., DQL). The memory 100 may be connected at a connection 119 to a pin (e.g., DQR). The pins DQL and DQR may be implemented as read/write data pins (e.g., I/O pins) or any other type pins in order to meet the criteria of a particular implementation. The pins DQL and DQR may write data to and/or read data from the dual port memory 100.

Figure 3:
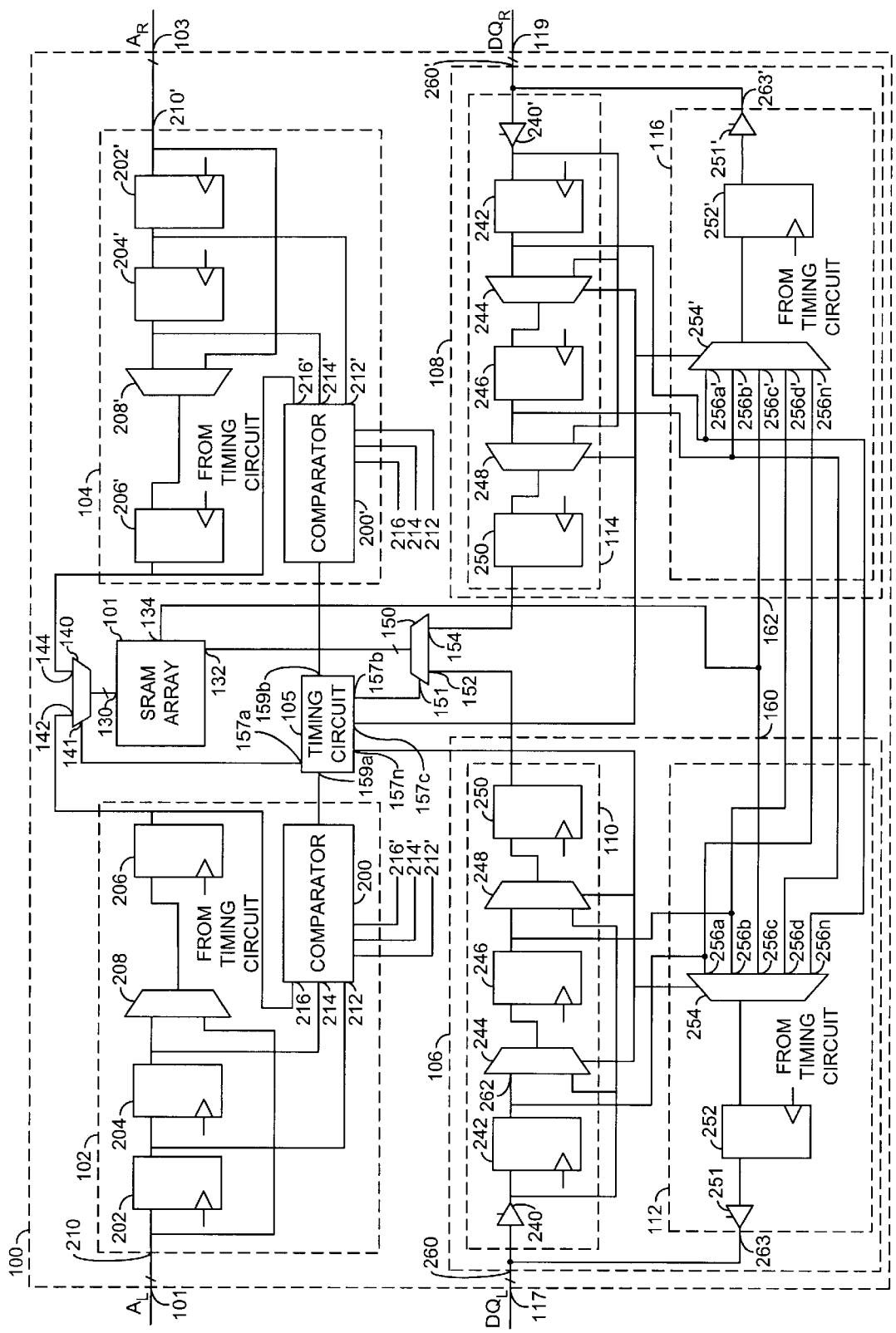
FIG. 3 is a more detailed block diagram of the circuit of FIG. 2.

Referring to FIG. 3, a detailed block diagram of the memory 100 is shown. The dual port memory 100 generally comprises a memory array 101, an address section (or circuit) 102, an address section (or circuit) 104, a timing circuit 105, a data section (or circuit) 106 and a data section (or circuit) 108. The data section 106 generally comprises a data write section (or circuit) 110 and a data read section (or circuit) 112. The data section 108 generally comprises a data write section (or circuit) 114 and a data read section (or circuit) 116. In general, the address section 102 and the data section 106 may be considered one "port" (e.g., the left port) and the address section 104 and the data section 106 may be considered another port (e.g, the right port).

In one example, the memory array 101 may be implemented as a 6T cell Static Random Access Memory (SRAM). However, any number of cells may be implemented in order to meet the criteria of a particular implementation. The SRAM 101 may have an input 130 that may receive address information, an input 132 that may receive data and an output 134 that may present data. The input 130, the input 132 and the output 134 may be implemented as multi-bit inputs. The input 130 may receive address information from a multiplexer 140. The multiplexer 140 may receive a first set of address information at an input 142 and a second set of address information at an input 144. The multiplexer 140 generally presents the information received at the input 142 or the information received at the input 144 to the input 130 of the SRAM 101 in response to a timing signal received at an input 141. Similarly, a multiplexer 150 may have an input 152 that may receive data from the data section 106 and an input 154 that may receive data from the data section 108. The multiplexer 150 generally presents either the information received at the input 152 or the information received at the input 154 to the input 132 of the SRAM 101 in response to a timing signal received at an input 151. The output 134 generally presents information read from the SRAM 101 to an input 160 of the data section 106 and an input 162 of the data section 108. The timing circuit 105 may present timing signals at a number of outputs 157a–157n in response to control signals received at inputs 159a and 159b.

The address section 102 generally comprises a comparator 200, a flip-flop 202, a flip-flop 204, a flip-flop 206 and a multiplexer 208. The flip-flop 202 generally receives address information from the address input $A_L$ from an input 210. The address input $A_L$ may be, in one example, a multi-bit signal. The output of the flip-flop 202 is generally presented to an input of the flip-flop 204 as well as to an input 212 of the comparator 200. The output of the flip-flop 204 is generally presented to a first input of the multiplexer 208 as well as to an input 214 of the comparator 200. The multiplexer 208 may also have a second input that may receive the address input $A_L$ from the input 210. The multiplexer 208 generally presents an output to the flip-flop 206. The output of the flip-flop 206 may be presented to the input 142 of the multiplexer 140 as well as to an input 216 of the comparator 200. The address section 104 generally has similar components as the address section 102 which are indicated with primed reference numbers.

In general, all the flip-flops in FIG. 3 are triggered by the rising edge of the clock signal $CLK_L$ or $CLK_R$, except for the flip-flops 206, 206', 252 and 252'. The flip-flop 206 may be triggered by the rising edge of a clock delayed and generated from the signal CLKL by the timing circuit 105. The flip-flop 206 ' may be triggered by the rising edge of a clock delayed and generated from the signal $CLK_R$ by the timing circuit 105. The flip-flop 252 may be triggered by the rising edge of a clock delayed and generated from the signal $CLK_L$ by the timing circuit 105. The flip-flop 252' may be triggered by the rising edge of a clock delayed and generated from the signal $CLK_R$ by the timing circuit 105.

The data write section 110 of the data section 106 generally comprises a buffer 240, a flip-flop 242, a multiplexer 244, a flip-flop 246, a multiplexer 248 and a flip-flop 250. The data read circuit 112 generally comprises a buffer 251, a flip-flop 252, and a multiplexer 254. The buffer 240 generally receives data from the pin $DQ_L$ at an input 260. The signal received from the pin DQL may be, in one example, a multi-bit signal. The signal received from the pin $DQ_L$ may be presented to an input 262 of the flip-flop 242, a first input of the multiplexer 248, and a first input of the multiplexer 244. The output of the flip-flop 242 is generally presented to a second input of the multiplexer 244 as well as to an input 256a of the multiplexer 254.

The output of the multiplexer 244 is generally presented to an input of the flip-flop 246. The output of the flip-flop 246 is generally presented to a second input of the multiplexer 248 as well as an input 256b of the multiplexer 254. The output of the multiplexer 248 is generally presented to an input of the flip-flop 250. An output of the flip-flop 250 is generally presented to the input 152 of the multiplexer 150. The data received at the input 160 is generally presented to an input 256c of the multiplexer 254. The output of the multiplexer 254 is generally presented to an input of the flip-flop 252. The output of the flip-flop 252 is generally presented to an output 263 through the buffer 251. The data section 108 has similar components as the data section 106 that are indicated with primed reference numbers. The data sections 106 and 108 may be interconnected. For example, the output of the flip-flop 242 may be presented to the input 256n' of the multiplexer 254'; the output of the flip-flop 246' may be presented to the input 256d' of the multiplexer 254'; the input 256c of the multiplexer 254 may be connected to the input 256c' of the multiplexer 254'; the output of the flip-flop 246' may be presented to the input 256d of the multiplexer 254; the output of the flip-flop 242' may be presented to the input 256n of the multiplexer 254. The multiplexers 244, 244', 248, 248', 254, and 254' may be controlled by one or more timing signals that may be received from the timing circuit 105.

Figure 4:
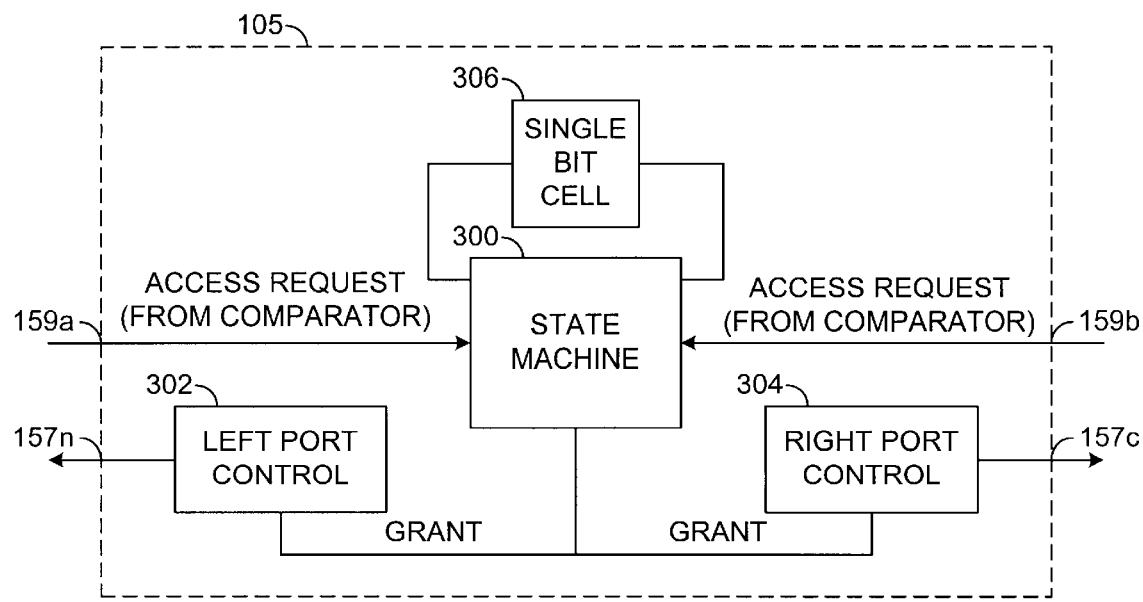
FIG. 4 is a block diagram of the circuit of FIG. 2.

Referring to FIG. 4, a block diagram of the timing circuit 105 is shown. The timing circuit 105 generally comprises a state machine 300, a left port control block (or circuit) 302, a right port control block (or circuit) 304 and a single bit cell block 306. In one example, the state machine 300 may be implemented as an asynchronous state machine.

The dual port memory 100 generally observes both left and right port clocks and generally starts the operation on the port that has the first rising edge on their respective clocks. The internal operations on the selected port are generally completed as an uninterrupted operation, even if a rising edge on the other port occurs before the operation of the first port are completed. The timing circuit 105 normally keeps track of the rising edges of the clocks of each port and presents the appropriate timing signals. The second port generally has to be initiated after the accesses by the first port are completed. To avoid more complications in the design, there may be a maximum clock skew specified between the rising edges of both the clocks as defined by the following EQ1:

$$2*\text{Taccess}+\text{Tskew}+\text{Tlogic}<=\text{Tcyc},$$

where Tcyc is the minimum clock period, Taccess is the maximum time to complete an access through the memory array 101, Tskew is the maximum skew between the two clocks, and Tlogic is the maximum time for the logic and data forwarding inside the SRAM 101. In the instance of both the clocks rising edges occurring simultaneously, one port (e.g., the left port) may be granted the highest priority. However, the right port may be granted the highest priority in certain design applications.

The timing circuit 105 generally monitors the clocks and the other signals presented to both the ports. The state machine 300 may be implemented as an asynchronous state machine that may be initiated by either of the clocks. The timing circuit 105 generally controls the access to the two different ports.

The timing circuit 105 grants control to the port that has the first rising edge. If the two clock edges are received simultaneously, one port (such as the left port) may receive access to complete the operation, while the right port is generally given a busy signal (e.g., at the output 157c).

The timing circuit 105 may have a single bit cell 306 that may have timing characteristics that may be matched to the operation of the complete memory array 101. When a certain port is given access control, the timing circuit 105 may start a single bit read. The completion of the single bit read in the cell 306 generally indicates to the timing circuit that the particular port has completed the read or write and that the timing circuit 105 may properly grant access to the other port.

The dual port memory 100 may incorporate advanced logic to eliminate the wait states between a consecutive READ and WRITE operations and vice-versa. The memory 100 may increase the throughput drastically as compared with conventional dual port memories. The dual port memory 100 is generally designed to provide a 100% (or nearly 100%) bus efficiency by use of the two comparators 200 and 200' along with the timing circuit 105. The registers 202, 204 and 206 (and 202', 204' and 206') may be used for data forwarding from one cycle to another.

Figure 5:
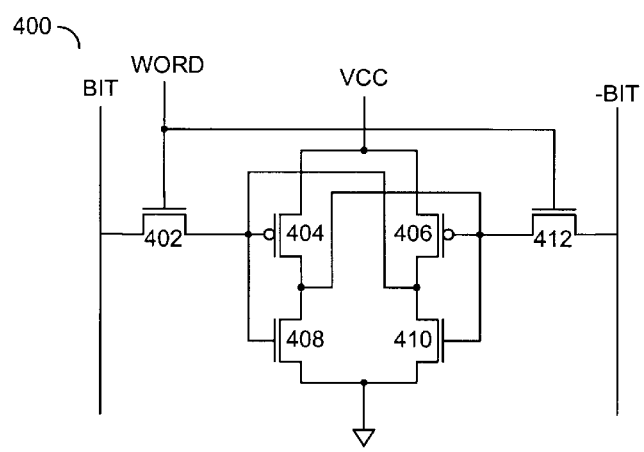
FIG. 5 is a block diagram of a 6-T cell that may be used with the circuit of FIG. 2.

Referring to FIG. 5, an example of a 6-T cell 400 that may be used to implement the SRAM array 101 is shown. The 6-T cell 400 generally comprises a transistor 402, a transistor 404, a transistor 406, a transistor 408, a transistor 410 and a transistor 412. A single positive bit-line (e.g., BIT) is generally presented to one of the terminals of the transistor 402 and a single negative bit-line (e.g., –BIT) is generally connected to a terminal of the transistor 412. The single bit-line configuration (e.g., BIT/–BIT) may require that information is read and written on the single pair of bit lines BIT/–BIT. The timing circuit 105 along with the various multiplexers in the read and write sections 102 and 106 may be used to accomplish such reading and writing.

Figure 6:
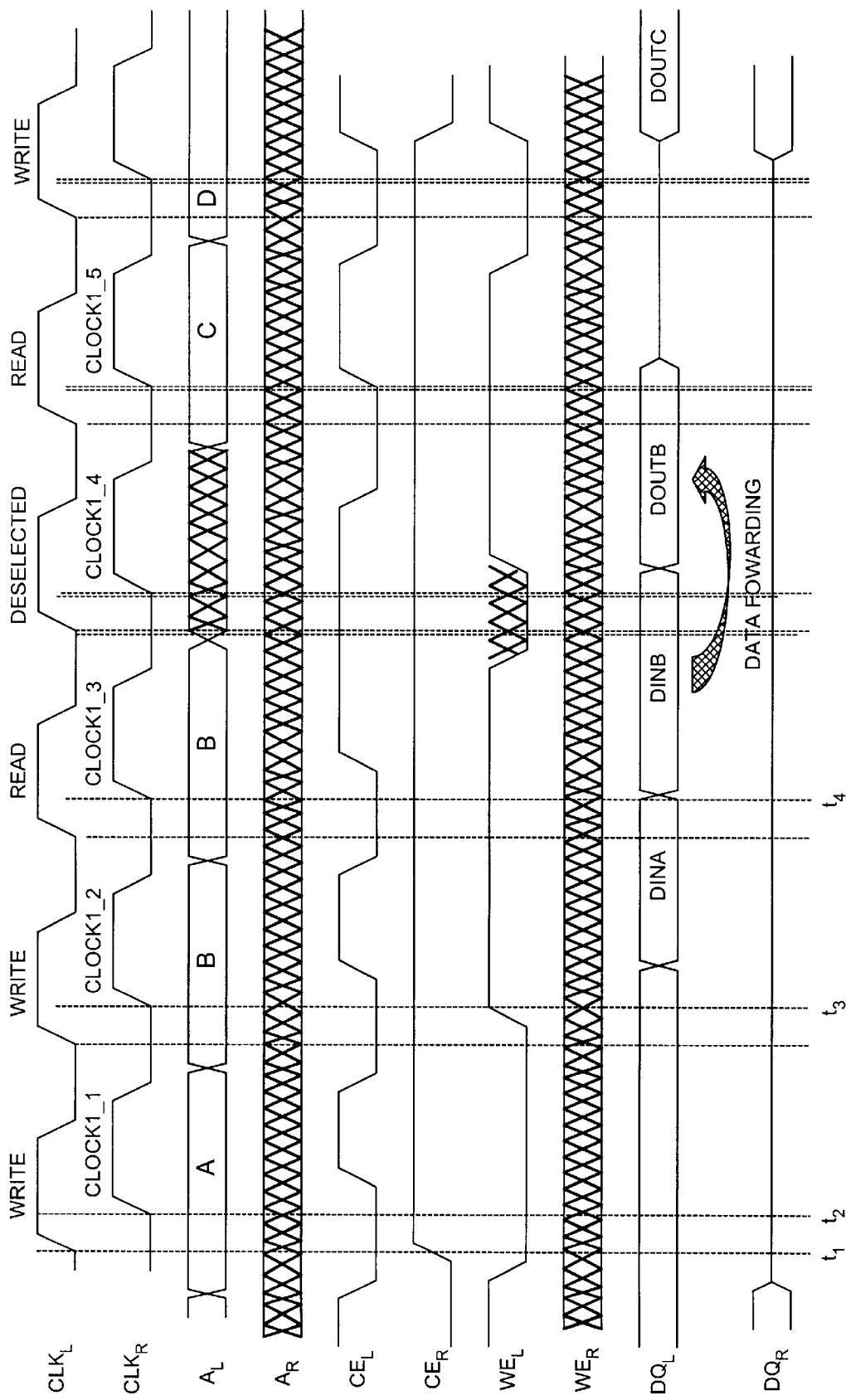
FIG. 6 is a timing diagram illustrating the operation of the dual port of FIG. 2.

Referring to FIG. 6 a timing diagram illustrating the access of the left and right ports of the memory 100 is shown. During an access, only one of the ports is active. The left port is shown with access in the timing diagram of FIG. 6. The clock signal CLKL is shown "high" at a time t1. The clock signal CLKL allows access to the left port while the right port is deactivated "low" at the time t1. A skew between the right and left clocks is shown as the time between the time t1 and a time t2. The skew may be implemented as any length of time (e.g., maximum or zero).

When the memory 100 accesses one of the ports left or right the other port is generally deselected. The memory 100 may be implemented as a synchronous SRAM with zero wait states, when only accessing a single port. The synchronous SRAM 100 may read and/or write including data forwarding. The data forwarding may include a back to back write followed by a read on the same address location, then the data would be forwarded to the output. The data forwarding may allow the data read to be the most current data.

On the clock signal CLKL a write is being performed on the left port on address location (A). The write is generally preformed when the chip select signal CEL and enable signal WEL both enabled and the chip select signal CER is disabled 1. The memory 100 may ignore the enable signal WER during a write to the left port.

On a rising edge of the clock signal CLKR at a time t2, the flip-flop 202 is generally triggered and may latch the current address (A). The current address in (A) is generally for a write. During the time t2 the enable signal WEL is generally sampled. If the sampled signal WEL is "low", then the time t2 is generally considered to be a write cycle.

On a rising edge of the clock signal CLKR at a time t3, the flip-flop 204 is generally triggered and may latch the output of the flip-flop 202. The flip-flop 202 may latch a new address received from the input 210. The new address (B) is generally also for a write.

On a rising edge of this clock signal CLKR at a time t4, the multiplexer 208 generally multiplexes the output of the flip-flop 204 to the flip-flop 206. The address (B) is generally latched by the flip-flop 206 and provided to the SRAM array 101 for a write. At the time t4 the multiplexer 240 is enabled. The multiplexer 240 is generally enabled by a signal received at the input 141 from the timing circuit 105. At the time t4 the multiplexer 248 is enabled by a signal received from the timing circuit 105. The multiplexer 248 is generally able to multiplex the output of the inverter 240 to the flip-flop 250. The flip-flop 250 may latch the output of the flip-flop 248 and may present the output to the SRAM array 101 to complete a write.

At the time t3 the enable signal WEL is sampled. If the sampled enable signal WEL is "high", the SRAM array 101 may start a read cycle. The SRAM array 101 may turn on the flip-flop 202 to latch in the read address (B). The output of the flip-flop 202 is generally also presented to the comparator 200. The comparator 200 may compare the address (B) with the outputs of the flip-flop 206 and the flip-flop 204.

During a time CLOCK1_3 the multiplexer 140 may move the address (A) into the SRAM array 101. During the time CLOCK1_3 the multiplexer 150 may move a data DinA into the SRAM array 101. The multiplexers 140 and 150 are generally implemented to complete a write cycle. Furthermore, during the time CLOCK1_3 the comparator 200 may compare the address outputs from the flip-flops 202, 204 and 206 to indicate to the timing circuit 105 if there was an address match.

During a time CLOCK1_4 the data for the write at the time t2 is generally latched into the memory 100. The data is generally stored in the flip-flop 242. During a time CLOCK1_5 the multiplexer 254 is generally enabled allowing data from flip-flop 242 to be transferred directly into register 252 and to the output of the inverter 251. The multiplexer 254 is generally enabled because the comparator 200 may have found a match between the address given for the write in the cycle CLOCK1_2 and the read in cycle CLOCK1_3. If the match had not occurred, the multiplexer 254 may have moved the data from one of the other sources into the outputs 256a–256n.

Figure 7:
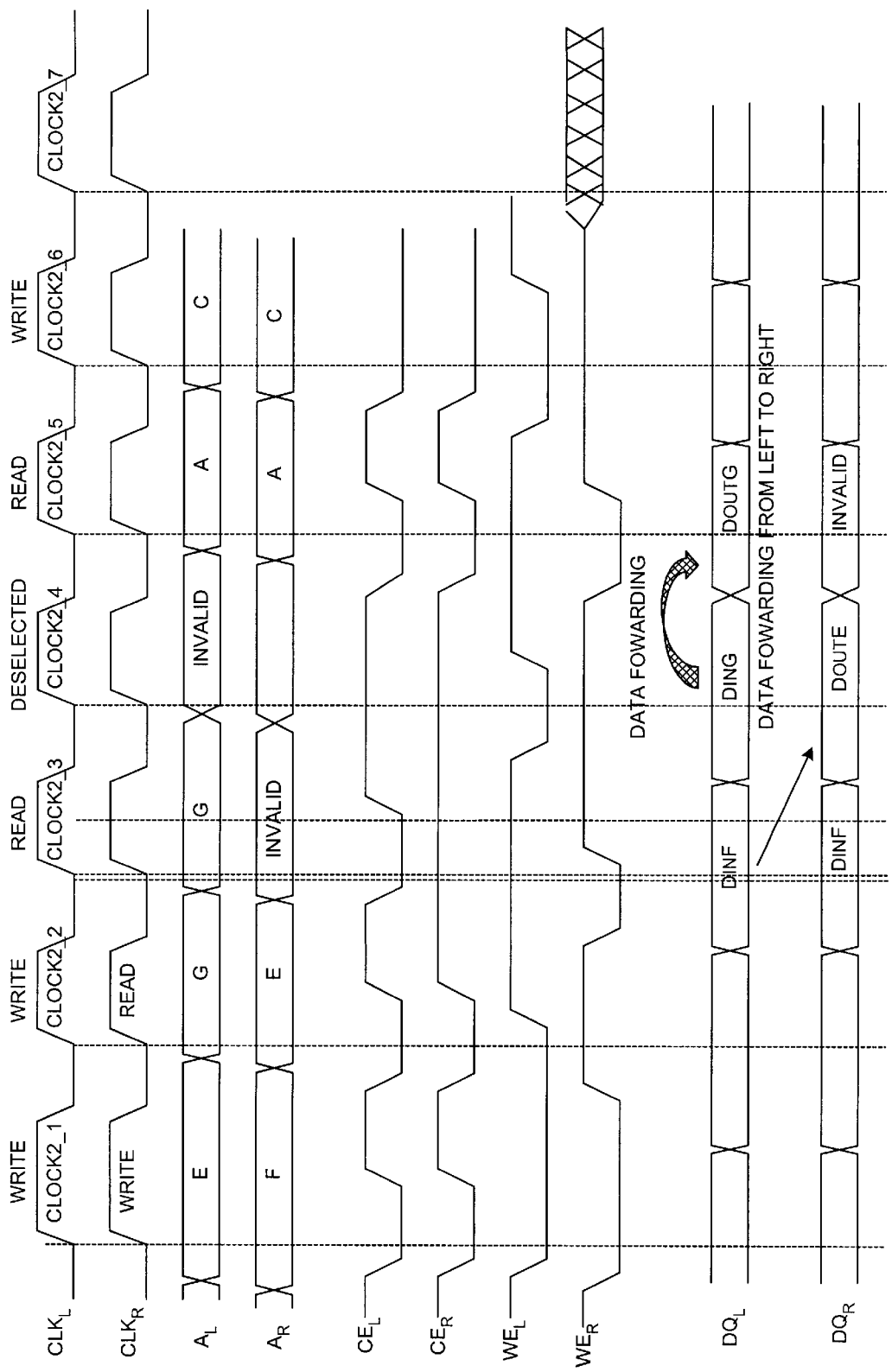
FIG. 7 is a timing diagram illustrating the access of the dual port memory of FIG. 2.

Referring to FIG. 7 a timing diagram illustrating the operation of the dual port memory 100 with no skew is shown. The clock signals CLKL and CLKR may be implemented identically when both ports are accessed together, with no skew between the clocks.

During a cycle CLOCK2_1 the flip-flop 202 may latch the left address (E), while the flip-flop 202' may latch the right address (F). The timing circuit 105 may recognize the active "low" chip select signals CEL and CER. The dual port memory 100 may be implement a write cycle on both the ports left and right. The timing circuit 105 is generally configured to prioritize access for the left port over the right port.

During a cycle CLOCK2_2 the flip-flop 202 may latch the new left address (G), while the flip-flop 202' may latch the new right address (E). The flip-flop 204 may latch the previous left address (E) of the flip-flop 202. The flip-flop 204' may latch the previous left address (F) from flip-flop 202'. The right side access is generally recognized as a read and the comparator 200' may start a compare of the output from the flip-flop 202 against the outputs of the flip-flops 204, 206, 204', and 206', as presented at the inputs 212, 214, 216, 212', 214' and 216'. If any of the addresses match, then the data may have to be forwarded.

During a cycle CLOCK2_2 the flip-flop 202 may latch the new address (G). The comparator 200 may start a compare of the output of the flip-flop 202 against the outputs of the flip-flops 204, 206, 204', and 206', as presented at the inputs 212, 214, 216, 212', 214' and 216'. The buffer 240 may move the input DQL into a latch of the flip-flop 242. A data DinE is generally latched into the flip-flop 242. The buffer 240' may move the input DQR into latch of the flip-flop 242'. A data DinF is generally latched into the flip-flop 242'. The latched data DinE is generally presented to multiplexer 254'. The multiplexer 254' may pass the data DinF into the input of flip-flop 252'.

During a cycle CLOCK2_4 the comparator 200 may signal a match between the read and write address. The I/O pin DQL is generally latched into the flip-flop 242. The output of the flip-flop 242 is passed through the multiplexer 254 into the flip-flop 252.

Figure 8:
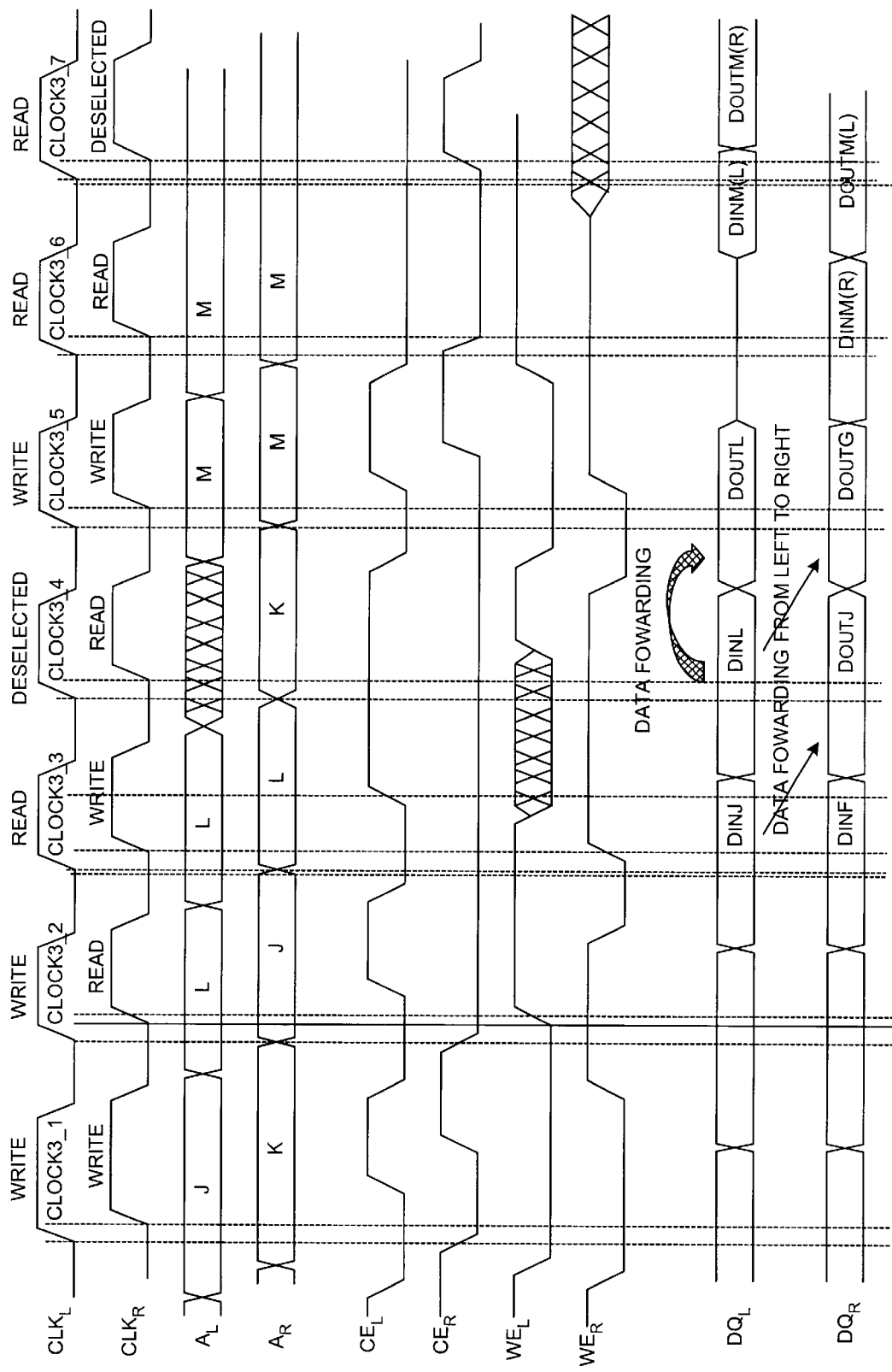
FIG. 8 is a timing diagram illustrating the access of the dual port memory of FIG. 2.

Referring to FIG. 8 a timing diagram illustrating the operation of the dual port memory 100 with a skew is shown. The clock signals CLKL and CLKR may be implemented with a skew. Both the left and the right ports may be implemented with a skew in the clock signal CLKL and CLKR. The timing of the dual port memory 100 with a skew may be similar to the timing diagram of FIG. 7. The dual port memory 100 may always grant priority to the left port.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A dual port memory comprising:
   a memory array configured to (i) write information to a first port or (ii) read information from a second port in response to (i) one or more first timing signals and (ii) one or more second timing signals;
   a first address circuit configured to present one or more first control signals in response to one or more first address signals;
   a second address circuit configured to present one or more second control signals in response to one or more second address signals;
   a timing circuit configured to present said one or more first timing signals and said one or more second timing signals in response to said one or more first control signals and said one or more second control signals;
   a first data circuit (i) comprising a plurality of first multiplexers configured to receive one or more of said timing signals and (ii) configured to read or write information in said memory array; and
   a second data circuit (i) comprising a plurality of second multiplexers configured to receive one or more of said timing signals and (ii) configured to read or write information in said memory array.

2. The dual port memory according to claim 1, wherein said dual port memory has zero latency.

3. The dual port memory according to claim 1, wherein:
   said first data section comprises a first write section and a first read section; and
   said second data section comprises a second write section and a second read section.

4. The dual port memory according to claim 3, wherein:
   said first write section comprises one or more of said first multiplexers;
   said first read section comprises one or more of said first multiplexers;
   said second write section comprises one or more of said second multiplexers; and
   said second read section comprises one or more of said second multiplexers.

5. The dual port memory according to claim 1, wherein:
   said first address circuit comprises a comparator configured to present said first one or more control signals; and
   said second address circuit comprises a comparator configured to present said second one or more control signals.

6. The memory according to claim 1, wherein said timing circuit comprises a state machine.

7. The memory according to claim 1, wherein said memory array comprises a plurality of static random access memory (SRAM) cells.

8. The memory according to claim 7, wherein each of said SRAM cells comprises a 6-T transistor cell.

9. The memory according to claim 8, wherein said SRAM cells have a single bit-line pair.

10. The dual port memory according to claim 1, wherein said first and second address circuits further comprise one or more flip-flops.

11. The dual port memory according to claim 1, wherein said first and second data circuits further comprise one or more flip-flops.

12. A dual port memory comprising:
   means for storing information configured to (i) write information to a first port or (ii) read information from a second port in response to (i) one or more first timing signals and (ii) one or more second timing signals;
   means for generating one or more first control signals in response to one or more first address signals;
   means for generating one or more second control signals in response to one or more second address signals;
   means for generating said one or more first timing signals and said one or more second timing signals in response to said one or more first control signals and said one or more second control signals;
   means for multiplexing read and write information at one or more first pins in response to one or more of said timing signals; and means for multiplexing read and write information at one or more second pins in response to one or more of said timing signals.

13. A method for reading and writing information to a memory comprising the steps of:
   (A) writing information to a first port or (ii) reading information from a second port in response to (i) one or more first timing signals and (ii) one or more second timing signals;
   (B) generating one or more first control signals in response to one or more first address signals;
   (C) generating one or more second control signals in response to one or more second address signals;
   (D) generating said one or more first timing signals and said one or more second timing signals in response to said one or more first control signals and said one or more second control signals;
   (E) multiplexing said information at one or more first pins in response to one or more of said timing signals; and
   (F) multiplexing said information at one or more second pins in response to one or more of said timing signals.

14. The method according to claim 13, further comprising the steps of:
   receiving one or more of said timing signals by one or more first multiplexers;
   receiving one of said timing signals by one or more second multiplexers;
   receiving one of said timing signals by one or more third multiplexers; and
   receiving one of said timing signals by one or more fourth multiplexers.

15. The method according to claim 13, further comprising the step of:
   generating said first one or more control signals by comparing one or more first address signals; and
   generating said second one or more control signals by comparing one or more second address signals.

16. The method according to claim 13, wherein said timing signals are generated with a state machine.

17. The method according to claim 16, wherein said information is written or read to a memory array comprising a plurality of static random access memory (SRAM) cells.

18. The method according to claim 17, wherein said SRAM cells comprise 6-T transistor cells.

19. The method according to claim 18, wherein said SRAM cells have a single bit-line pair.

20. The method according to claim 13, further comprising the step of:
   transferring information between said first pins and said second pins in response to one or more of said timing signals.

* * * * *